US011803203B2

(12) United States Patent
Maggi et al.

(10) Patent No.: US 11,803,203 B2
(45) Date of Patent: Oct. 31, 2023

(54) CURRENT SENSOR WITH MULTIPLE CHANNEL LOW DROPOUT REGULATOR

(71) Applicant: Silicon Laboratories Inc., Austin, TX (US)

(72) Inventors: Franco Maggi, Asker (NO); Peter Pap, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 116 days.

(21) Appl. No.: 17/473,197

(22) Filed: Sep. 13, 2021

(65) Prior Publication Data

US 2023/0081639 A1 Mar. 16, 2023

(51) Int. Cl.
*G05F 1/575* (2006.01)
*G01R 19/10* (2006.01)

(52) U.S. Cl.
CPC .............. *G05F 1/575* (2013.01); *G01R 19/10* (2013.01)

(58) Field of Classification Search
CPC .......... G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735
See application file for complete search history.

(56) References Cited

U.S. PATENT DOCUMENTS

| 6,177,783 | B1 * | 1/2001 | Donohue | H02J 1/102 323/272 |
| 6,559,623 | B1 * | 5/2003 | Pardoen | G05F 1/573 323/273 |
| 6,970,334 | B1 * | 11/2005 | Smith | G05F 1/575 361/18 |
| 7,253,589 | B1 * | 8/2007 | Potanin | H02J 7/00302 320/144 |
| 7,622,902 | B1 * | 11/2009 | Kao | G05F 1/575 323/280 |
| 7,863,869 | B1 * | 1/2011 | De Stasi | H02M 3/156 323/222 |
| 8,390,262 | B2 * | 3/2013 | Chang | H05B 45/38 315/250 |

(Continued)

FOREIGN PATENT DOCUMENTS

| EP | 282338 B1 * | 5/1993 | ........... A45D 34/042 |
| WO | WO-2014191787 A1 * | 12/2014 | ............... G05F 1/56 |

*Primary Examiner* — Thienvu V Tran
*Assistant Examiner* — Nusrat Quddus
(74) *Attorney, Agent, or Firm* — Zagorin Cave LLP

(57) ABSTRACT

An apparatus for measuring a current being supplied to a load includes a first pass transistor to couple a first sense resistance to the load when the first pass transistor is enabled and a second pass transistor to couple a second sense resistance to the load when the second pass transistor is enabled. An error amplifier determines a difference between a voltage being supplied to the load and a reference voltage and to supplies an error amplifier output signal according to the difference. A switch couples the error amplifier output signal to a gate of the first pass transistor or to a gate of the second pass transistor. Control logic controls the switch according to a value of the current being supplied to the load. The voltage being supplied to the load is controlled using the error amplifier output signal that is selectively coupled to the gate of the first pass transistor or the gate of the second pass transistor.

21 Claims, 4 Drawing Sheets

(56) References Cited

U.S. PATENT DOCUMENTS

| | | | |
|---|---|---|---|
| 9,465,057 B2* | 10/2016 | Aerts | G01R 19/0092 |
| 9,817,428 B2* | 11/2017 | Fronczak | G05F 3/267 |
| 9,917,513 B1* | 3/2018 | Le | G05F 1/56 |
| 9,961,742 B2* | 5/2018 | Ahn | H05B 45/395 |
| 10,571,942 B2* | 2/2020 | Tomioka | G05F 1/575 |
| 10,677,664 B1* | 6/2020 | Wong | G01K 15/005 |
| 11,599,133 B2* | 3/2023 | Saha | G05F 1/573 |
| 2005/0275394 A1* | 12/2005 | Moraveji | G05F 1/565 |
| | | | 323/312 |
| 2006/0044843 A1* | 3/2006 | Oswald | G01R 19/0092 |
| | | | 363/19 |
| 2006/0170401 A1* | 8/2006 | Chen | G05F 1/569 |
| | | | 323/273 |
| 2007/0046271 A1* | 3/2007 | Zolfaghari | G05F 1/575 |
| | | | 323/274 |
| 2007/0053115 A1* | 3/2007 | Tain | G05F 1/575 |
| | | | 361/18 |
| 2008/0116865 A1* | 5/2008 | Rice | H02M 3/1584 |
| | | | 323/280 |
| 2009/0091308 A1* | 4/2009 | Omi | H02M 3/1588 |
| | | | 323/282 |
| 2009/0128045 A1* | 5/2009 | Szczeszynski | H05B 45/347 |
| | | | 315/185 R |
| 2009/0278518 A1* | 11/2009 | Takagi | G05F 1/56 |
| | | | 323/282 |
| 2010/0244790 A1* | 9/2010 | La Rosa | H05B 45/397 |
| | | | 323/272 |
| 2011/0193538 A1* | 8/2011 | Arigliano | G05F 1/563 |
| | | | 323/282 |
| 2012/0038332 A1* | 2/2012 | Lin | G05F 1/575 |
| | | | 323/277 |
| 2012/0176112 A1* | 7/2012 | Singh | G05F 3/26 |
| | | | 323/284 |
| 2013/0049870 A1* | 2/2013 | Na | H03F 1/0261 |
| | | | 330/296 |
| 2016/0098050 A1* | 4/2016 | Enjalbert | G05F 1/575 |
| | | | 323/280 |
| 2016/0249423 A1* | 8/2016 | Huang | H05B 45/46 |
| 2017/0052552 A1* | 2/2017 | Mahmoudi | G05F 1/575 |
| 2017/0097649 A1* | 4/2017 | Lee | G09G 3/3696 |
| 2018/0011506 A1* | 1/2018 | Zeng | G05F 1/575 |
| 2019/0076552 A1* | 3/2019 | Li | G01T 1/2985 |
| 2019/0243400 A1* | 8/2019 | Tomioka | G05F 1/573 |
| 2019/0302819 A1* | 10/2019 | Hu | G05F 1/575 |
| 2019/0302820 A1* | 10/2019 | Yasusaka | G05F 1/575 |
| 2019/0384337 A1* | 12/2019 | Lu | G05F 1/575 |
| 2020/0073424 A1* | 3/2020 | Sakaguchi | G05F 1/575 |
| 2020/0091678 A1* | 3/2020 | Zou | H01S 5/0427 |
| 2021/0124383 A1* | 4/2021 | Iguchi | G05F 1/565 |
| 2022/0019253 A1* | 1/2022 | Zukowski | G05F 1/468 |
| 2022/0404849 A1* | 12/2022 | Chiu | G05F 1/561 |

* cited by examiner

CURRENT SENSOR WITH MULTIPLE CHANNEL LOW DROPOUT REGULATOR

BACKGROUND

Field of the Invention

This disclosure relates to measuring current consumption during device evaluation.

Description of the Related Art

Referring to FIG. 1, current measuring system 100 measures current consumption of low power devices by means of a resistor 101 in series between the power supply 102 and the load 103. The analog front end 105, implemented as an amplifier, measures the voltage across the series resistor, and that voltage is converted to a current value by downstream logic. Use of series resistors allow simple, reliable, and accurate measurements. Series resistors used for current measurement can be found in tools used to evaluate current consumption in Internet of Things (IOT) devices. For example, the load 103 in FIG. 1 can be an IOT device represented by capacitance and a variable resistive load. Note that although IoT devices are often battery powered, debug/evaluation tools are usually not battery powered and so power dissipation does not prevent use of resistive current sensors in a debug/evaluation setting. A battery powered device would likely suffer low head room if a series element were introduced between voltage source (battery) and consumer device (e.g., a micro controller unit (MCU) and associated peripherals).

The RC filter formed by the sense resistor and the bulk capacitance associated with load 103 governs the current measurement of FIG. 1, disregarding the architecture of the AFE block. Debug/evaluation tools, also referred to in the industry as starter kits, which are used to evaluate IOT devices, typically provide a regulated voltage rail to the target device (load). FIG. 2 illustrates a simplified block diagram of a current measurement system 200 that includes the sense resistor 201, power supply 203, and a consumer device and bulk capacitance forming the load 205. FIG. 2 further illustrates the use of a low dropout (LDO) voltage regulator 207 to provide the regulated voltage to load 205. The LDO receives a feedback signal of the voltage being supplied to the load and a reference voltage (not shown in FIG. 2) and adjusts the voltage supplied from power source 203 to thereby supply the desired regulated voltage.

The main difference between the system 100 of FIG. 1 and the system 200 of FIG. 2 the fact that the sense resistor of system 200 forms part of a voltage feedback loop and does not contribute to further voltage drop outside the linear voltage regulation, and thus maintains a constant voltage across the load, while the sense resistor of FIG. 1 forms a passive filter with the bulk capacitance and the load voltage varies with the current consumption.

Assuming the same values are used for the sense resistor and load capacitance, the current measurement of the system 200 will also be governed by the same RC time constant as for system 100, but the RC time constant will be incorporated in the regulation loop of the LDO. The measured current will then be the current the LDO supplies to the bulk capacitance to keep the target (load) voltage stable. In other words, it will be dominated by the frequency response of the LDO, and hence provides a more dynamic indication of what the load is doing, which is useful while debugging.

FIG. 3 illustrates a system 300 where multiple sense resistors 301 and 303 are multiplexed by means of analog switches 305 to improve the accuracy of the current measurement by matching the resistance selected to the current being consumed by the load. Better matching of the resistance to the current load improves the signal to noise ratio of the current measurement, particularly for low power IOT devices. Assume resistor 301 has a higher resistance than resistance 303. The control for the analog multiplexer is based on the measured current. For a higher range of currents the multiplexer selects the lower resistance 303 and for a lower range of current the higher resistance 301 is selected. In an embodiment analog multiplexer 305 utilizes two transistors that are turned on/off according to the current consumption being measured. For example, the voltage out of the analog front end (AFE) 307, implemented in an embodiment by an amplifier with a fixed gain, is supplied to one or more comparators that compares the voltage supplied to a threshold voltage. The threshold voltage may be a single threshold value or can be based on which resistor is being used for the present current measurement. The comparator output is used to control the transistors and therefore the current path and resistance used for current sensing. In one approach, the comparator output is a binary output that turns on one of the transistors in the analog multiplexer 305 and turns off another one of the transistors in the analog multiplexer 305. System 300 includes LDO 309.

While the LDO system 300 improves on the system of FIGS. 1 and 2, further improvements in accuracy of current measurements is desirable, especially for low power IOT devices.

SUMMARY OF EMBODIMENTS OF THE INVENTION

Accordingly, in an embodiment an apparatus for measuring a current being supplied to a load includes a first pass transistor to couple a first sense resistance to the load and a second pass transistor to couple a second sense resistance to the load. An error amplifier determines a difference between a voltage being supplied to the load and a reference voltage and supplies an error amplifier output signal according to the difference. A switch circuit supplies the error amplifier output signal to the first pass transistor or to the second pass transistor based on the current being supplied to the load.

In another embodiment a method for measuring a current being supplied to a load includes selectively causing current to flow to the load through a first pass transistor and a first sense resistance or a second pass transistor and a second sense resistance according to the current being supplied to the load. The method further includes comparing a reference voltage to a load voltage being supplied to the load in an error amplifier and supplying an error amplifier output signal according to a difference between the reference voltage and the load voltage. The error amplifier output signal is selectively coupled to the first pass transistor or the second pass transistor according to the current being supplied to the load to thereby select the first sense resistance or the second sense resistance to carry the current to the load.

In another embodiment an apparatus for measuring a current being supplied to a load includes a first pass transistor to couple a first sense resistance to the load when the first pass transistor is enabled and a second pass transistor to couple a second sense resistance to the load when the second pass transistor is enabled. An error amplifier determines a difference between a voltage being supplied to the load and a reference voltage and supplies an error amplifier output signal according to the difference. A switch circuit couples the error amplifier output signal to a gate of at least the first pass transistor or to at least a gate of the second pass transistor. Control logic controls the switch circuit according to a value of the current being supplied to the load. The voltage being supplied to the load is controlled using the error amplifier output signal that is selectively coupled at least to the gate of the first pass transistor or at least to the gate of the second pass transistor.

In another embodiment an apparatus for measuring a current being supplied to a load includes a first pass transistor to couple a first sense resistance to the load and a second pass transistor to couple a second sense resistance to the load. A first error amplifier is selectively enabled to supply to a gate of the first pass transistor a first error amplifier output signal indicative of a first difference between a voltage being supplied to the load at a first time and a reference voltage. A second error amplifier is selectively enabled to supply to a gate of the second pass transistor a second error amplifier output signal indicative of a second difference between the voltage being supplied to the load at a second time and the reference voltage. Control logic enables the first error amplifier according to a first value of the current being supplied to the load and enables the second error amplifier according to a second value of the current being supplied to the load.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

While evaluating IOT devices (and other devices) very different current requirements can occur at different times. For example, many IOT devices have low power radios and the current consumption can change in such devices from $10^{-8}$ A to $10^{-1}$ A, e.g., when the IOT device begins a radio transmission or otherwise engages in activity performed intermittently. The range of currents can be difficult to measure accurately. If the same sense resistor is used over the range of possible currents, the accuracy of the measurement can suffer at low currents if the resistance if optimized for higher currents. The resistor should be dimensioned in a such way to prevent high currents reducing voltage to the load too much and to keep the signal to noise ratio (SNR) as high as possible with low currents. That represents a challenge for accurate measurements over the entire range, given an analog to digital converter following the analog front end that has a fixed resolution and reference voltage. While the system 300 of FIG. 3 improves measurement accuracy by providing multiple sense resistance, the approach still has shortcomings.

Figure 1:
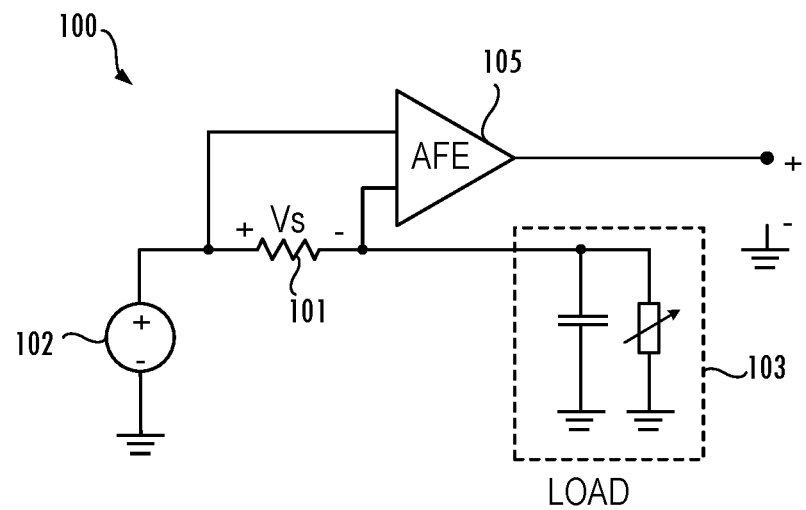
FIG. 1 illustrates a typical use case of a current measurement system using a resistor interposed between the power supply and the load used to measure the current.
Figure 2:
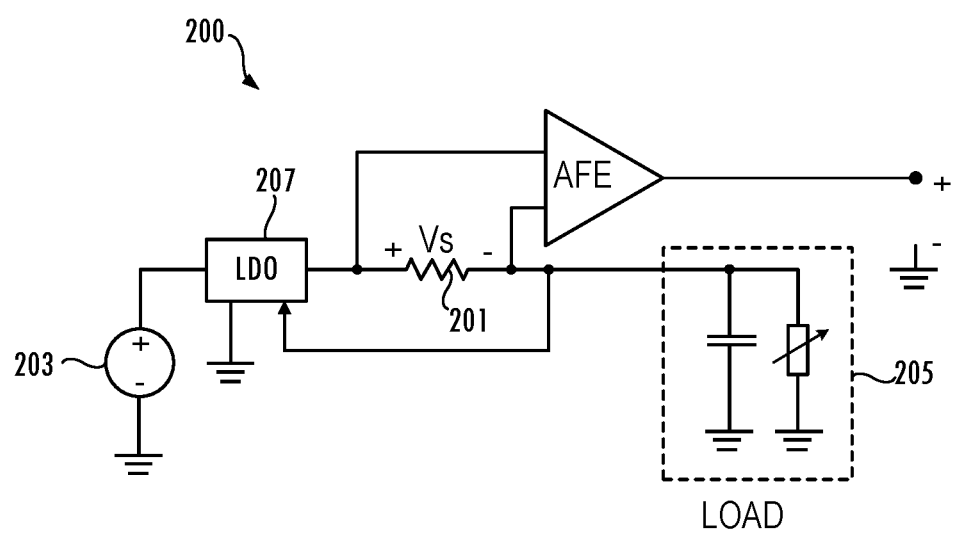
FIG. 2 illustrates a current measurement system using a resistor in series with the load and a low dropout regulator to maintain a stable voltage for the load.
Figure 3:
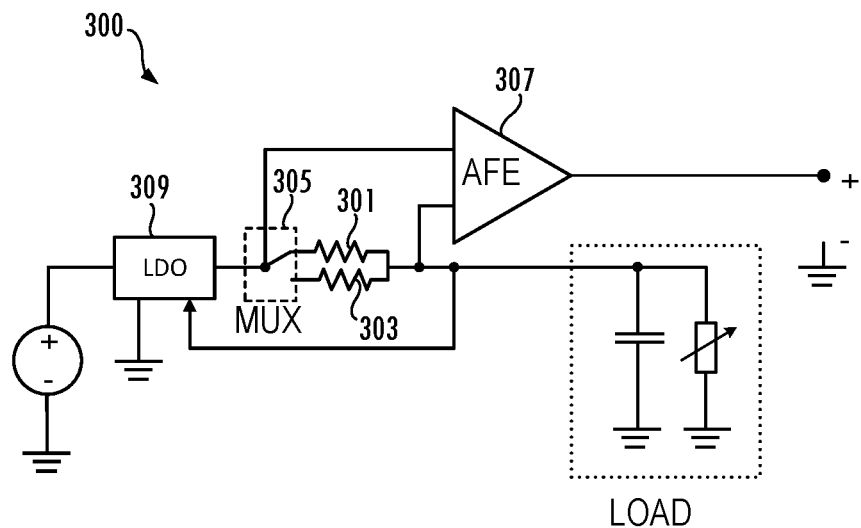
FIG. 3 illustrates a current measurement system using an LDO coupled to multiple resistors that can be selected according to current utilization by the load.
Figure 4:
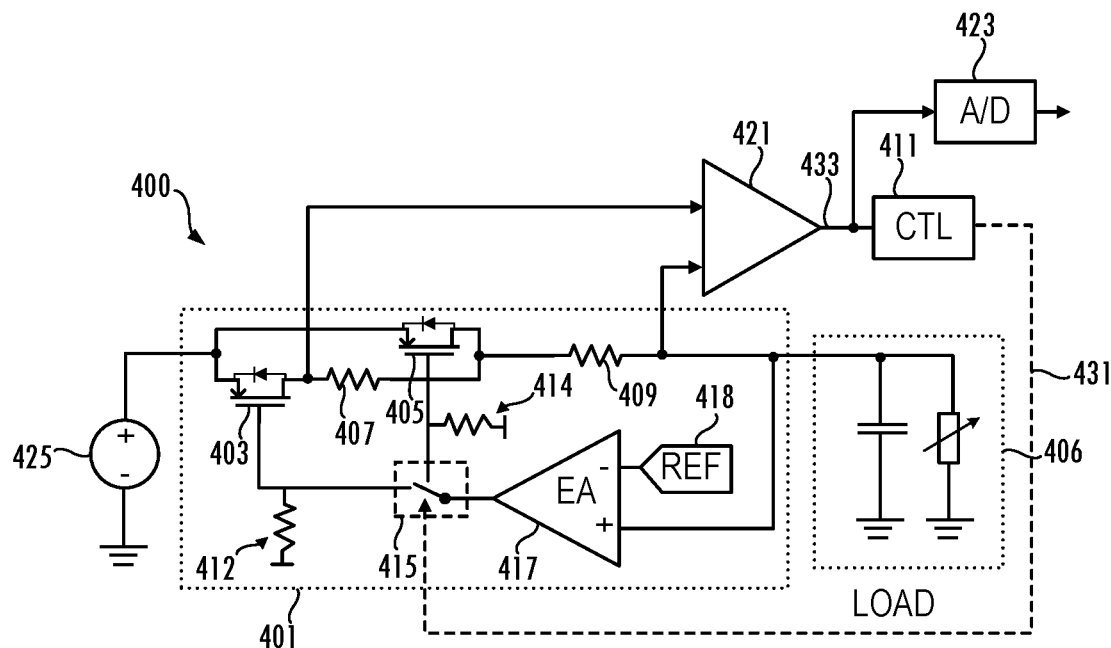
FIG. 4 illustrates an embodiment of a further improved current measurement system using multiple resistors and pass transistors integrated as part of a low dropout voltage regulator.

Accordingly, referring to FIG. 4, a current sense system 400 includes a multiple-channel low dropout regulator with integrated I-V conversion provides high performance current sensing with advantages over the system shown in FIG. 3. The current sensor architecture of system 400 merges the multiplexer function into the function of the LDO 401. The LDO 401 is a multichannel LDO, where different pass transistors 403 and 405 select the sense resistance path to carry the current to the load 406. The selected sense resistance depends on the current consumption level. When the current utilization is low (e.g., lower than a low current threshold), the control logic 411 causes switch 415 to couple the output of error amplifier 417 to the gate of transistor 403 to select the higher resistance path that includes resistor 407 in series with resistor 409. When the current utilization is high (e.g., above a high current threshold), the control logic 411 causes switch 415 to couple the output of error amplifier 417 to the gate of transistor 405 to select the lower resistance path that includes only resistor 409. In an embodiment resistor 409 is 0.5 ohms and resistor 407 is 10 ohms. Of course, other resistor values can be used according to system needs. In the embodiment of FIG. 4 the transistors 403 and 405 are P-channel devices and the gates are pulled up through a pull-up circuits 412 and 414 to a voltage, e.g., VDD to ensure the transistor that is not selected by switch 415 is turned off. When selected, the transistor acts as part of the LDO to control the voltage being delivered to the load 406 with the current flowing through the selected transistor dependent on the gate voltage supplied by the error amplifier to the selected transistor.

The FETs 403 and 405 work in saturation (active) mode, requiring a lower gate-source working voltage. Note that the series switches 305 of FIG. 3, which are external to the LDO, are eliminated from the loop along with their parasitic resistance, thereby increasing headroom for the LDO. Note that it is desirable to limit spurious charges in the gate path to transistors 403 and 405, which would otherwise be responsible for momentarily altering the voltage regulation and create undesired artifacts in current measurements. For that reason, switch 415 preferably utilizes bipolar transistors, e.g., two NPN transistors.

To better describe how the embodiment of FIG. 4 works, it is helpful to look at the basic building blocks of an LDO. The load 406 is a variable load and could be, e.g., an MCU or a group of ICs. The error amplifier 417 senses the load voltage and adjusts its output voltage to keep the positive input (the load voltage) as close as possible to the reference voltage 418 on the negative input. The reference voltage can be fixed, e.g., a bandgap voltage or variable voltage, making this architecture suitable also for power buffers. The LDO control loop is closed by the transistors 403 and 405, which act as pass elements. The AFE 421, which is implemented as an amplifier with a gain suitable both for the input voltage supplied and for the analog to digital converter (A/D) 423 that follows the AFE, supplies the sensed voltage to the control logic 411. The control logic 411 determines which of the pass elements is connected to the error amplifier 417 based on the current consumption. Depending on the implementation of the AFE, the resistor selection might or might not be mutually exclusive. The A/D 423 supplies downstream logic with digital values corresponding to the sensed voltage, which is then converted to a current value for display or other uses by the system. The resistors forming the resistance can be in parallel, in series, or a combination to provide the desired resistance values for the range of current being measured. In addition, while switch 415 in an embodiment selects either transistor 403 or transistor 405 to be connected to the output of the error amplifier 417, in another embodiment switch 415 selects transistor 403, transistor 405, or both transistors to be coupled to the output of the error amplifier 417, or just one of the transistors or both of the transistors. In an embodiment the switch 415 is implemented as two NPN transistors, and the control signal (s) 431 are implemented as two signal lines, which are supplied as complementary signals from control logic 411 to turn on one or the other NPN transistor in switch 415 to couple the output of the error amplifier 417 to just one of the transistors 403 and 405. The control logic can also control the control signals 431 to have the same value to turn on both NPN transistors and thereby couple the output of the error amplifier 417 to both transistor 403 and transistor 405. The goal of the switch in conjunction with the control logic is to select an appropriate sense resistance that matches the current being provided to the load 406. In addition, while FIG. 4 shows two current paths through transistor 403 or through transistor 405, in other embodiments more than two sense resistances are utilized and thus more than two resistance paths to better match wide current ranges. In such an embodiment multiple threshold values (e.g., high, medium, low) are used to determine which current path to activate. Note that it is important that the LDO limits the voltage drop quickly enough to maintain load regulation. In particular, if the low resistance does not kick in quickly enough to accommodate a sudden current demand, the load can be choked.

The architecture of the current measuring system of FIG. 4 reduces the number of series elements, thus increasing voltage headroom, and deals with multiplexing in a different way than the hard-switched solution shown in FIG. 3 to reduce artifacts in current sensing.

One challenge for starter kits used to bring up and debug new systems resides in offering precise current readings while supporting a wide current range. Consequently, relatively large pass transistors 403 and 405 of FIG. 4 are needed to support large currents. Furthermore, the current measurement device is required to convey nearly 100% of the input current to the output, to avoid significant gain errors. Those constraints point to large FETs, hence relatively large gate charges moving, which can affect reading currents in the nano- to microampere range. Gate-source voltages driven by the error amplifier 417 of FIG. 4 are minimal at light loads, hence the effect of the stray capacitance on the output are also minimized, compared to the switching FETs of FIG. 3, which are driven by fixed logic voltages.

Good phase and gain margins help ensure smooth transitions and load regulation. Introducing an amount of gain in the LDO feedback loop helps keep the open-loop gain under control, e.g., by scaling the input node to the EA. That also allows additional possibilities for compensation, e.g., adding a small reactance in the feedback loop. In embodiments, the pull-up networks 412 and 414 are used to tune and differentiate the bias level of the output stage of EA 417, depending on which sense resistance path is selected.

The control logic 411 can be implemented in analog or digital logic. If implemented in digital logic, the analog to digital converter (A/D) 423 supplies the control logic with a digital value corresponding to the voltage sensed by the analog front end 421. The digital value is compared to a digital threshold and the result of the compare is supplied as control signal(s) 431. The control signal(s) 431 control the switch 415. One of the control signals turns on one of the transistors in switch 415 and another of the control signals turns off the other transistor in the switch 415. There may be multiple digital thresholds based on which sense resistance is currently being used. For example, a first threshold is associated with the current load changing from a low current to a high current and a second threshold is used when changing from a high current to a low current. Such an approach can provide hysteresis and prevent switching too frequently. Such thresholds can be programmable. Note that if the threshold depends on the machine-state, in embodiments the system keeps track of which sense resistance is active to provide an appropriate threshold.

Figure 5:
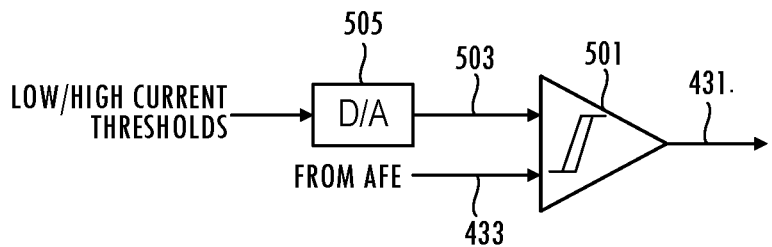
FIG. 5 illustrates an embodiment of control logic using a Schmitt trigger comparator and a programmable reference voltage to select the sense resistance used in the current measurement system.

In another embodiment, the control logic utilizes at least one comparator. Referring to FIG. 5, in another embodiment the control logic includes a comparator 501 that compares the output 433 of the AFE to a threshold voltage 503 supplied to the comparator. There may be multiple voltage thresholds based on which sense resistance is currently being used. For example, a first threshold is associated with the current load changing from a low current to a high current and a second threshold is used when changing from a high current to a low current. The threshold may be supplied by a digital to analog converter 505 and the digital value supplied to the D/A changes according to which sense resistance is being used. In other embodiments, a dedicated AFE and a single threshold is used. The comparator determines if the sensed voltage (and thus the current supplied to the load) is above or below the supplied threshold(s). If above, indicating a high current load, the lower sense resistance is selected and if below the threshold, the low current load is selected. The output of the comparator controls the switch 415. In an embodiment the switch 415 is formed by two bipolar transistors and thus the output of the comparator is converted into two signals to control the two bipolar transistors, e.g., by using an inverter in the path to one of the transistors to invert the signal to one of the transistors to ensure voltage is applied to the base of only one of the transistors at a time while the other transistor is shut off.

Figure 6:
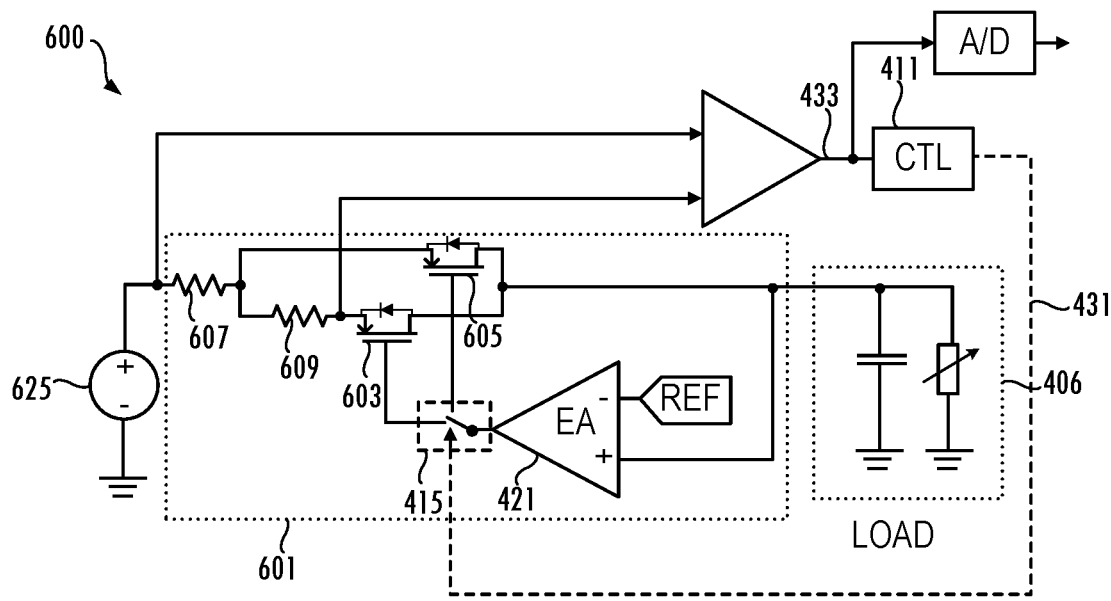
FIG. 6 illustrates an embodiment of a current measurement system using multiple sense resistors and pass transistors in a common drain configuration integrated as part of a low dropout voltage regulator.

While FIG. 4 illustrates a common source configuration with the sources of transistors of 403 and 405 coupled to the power supply 425, FIG. 6 illustrates that the approach of FIG. 4 also works in a current measurement system 600 having a common drain configuration for transistors 603 and 605 with the sense resistors 607 and 609 connected to the voltage source 625. A common drain configuration can extend the working range for some topologies of current sense amplifiers used in the AFE and increases options for thermal management in PCB layout.

Figure 7:
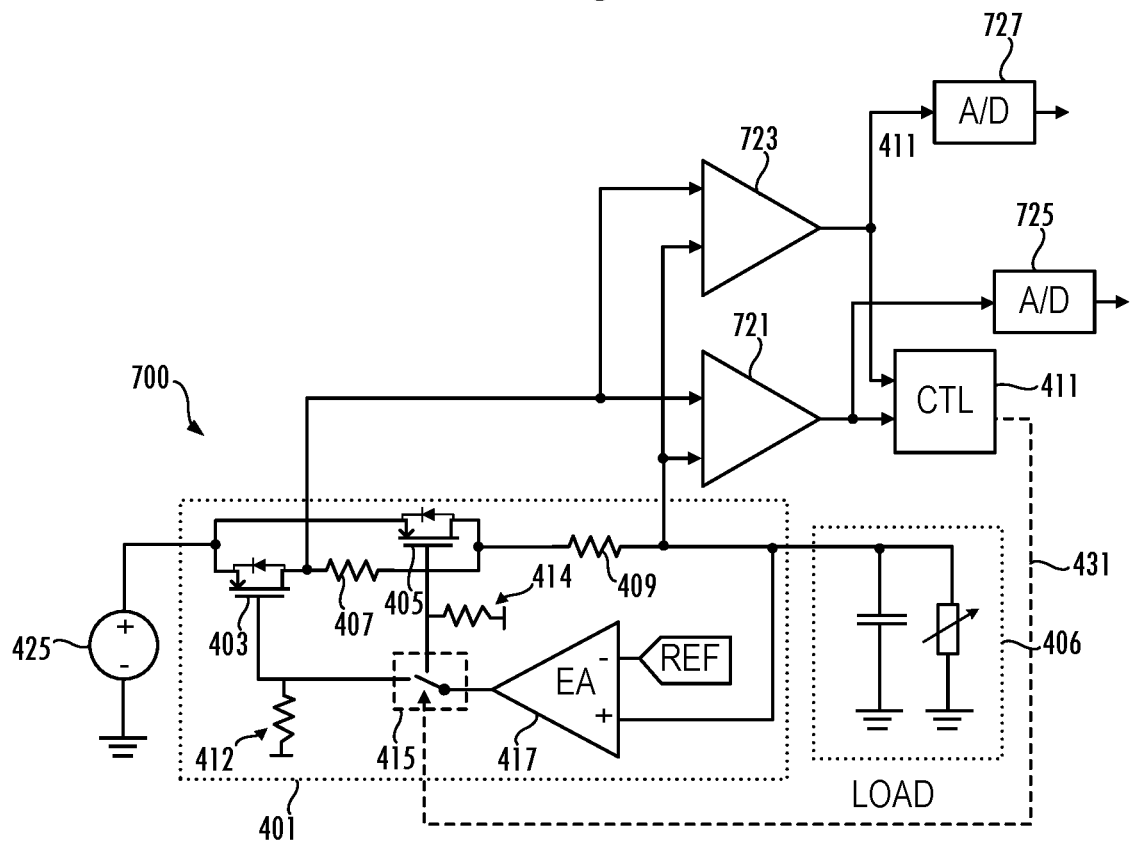
FIG. 7 illustrates an embodiment of a current measurement system using multiple sense resistors and pass transistors and having multiple analog front ends to measure the voltage across the sense resistors.

While the embodiments illustrated in FIGS. 4 and 6 have a single analog front end, FIG. 7 illustrates another embodiment of a current measurement system 700, in which multiple analog front ends 721 and 723 are used, one for amplifying the voltage associated with high current across a low sense resistance and one for amplifying the voltage associated with low current across a high sense resistance. The gain factors of the amplifiers are slightly different to maximize accuracy of the current measurements. Such an embodiment utilizes multiple analog to digital converters (A/Ds), 725 and 727, one for each AFE to convert the measurement to a digital value for further processing. The number of possible I/V gains for each sense resistance path increases proportionally with the number of AFEs. Two AFEs for two sense resistance paths (low resistance path for high current and high resistance for low current) provides two different resolutions in the low current range and two different resolutions in the high current range. Both ADC results are available at the same time. Control logic, which may be implemented in software running on a microcontroller or other programmable logic, chooses the result with the highest available gain without saturating the ADC, meaning that if the ADC connected to the AFE with the highest gain saturates, that value is discarded and the value read from the ADC with lower gain is kept.

Figure 8:
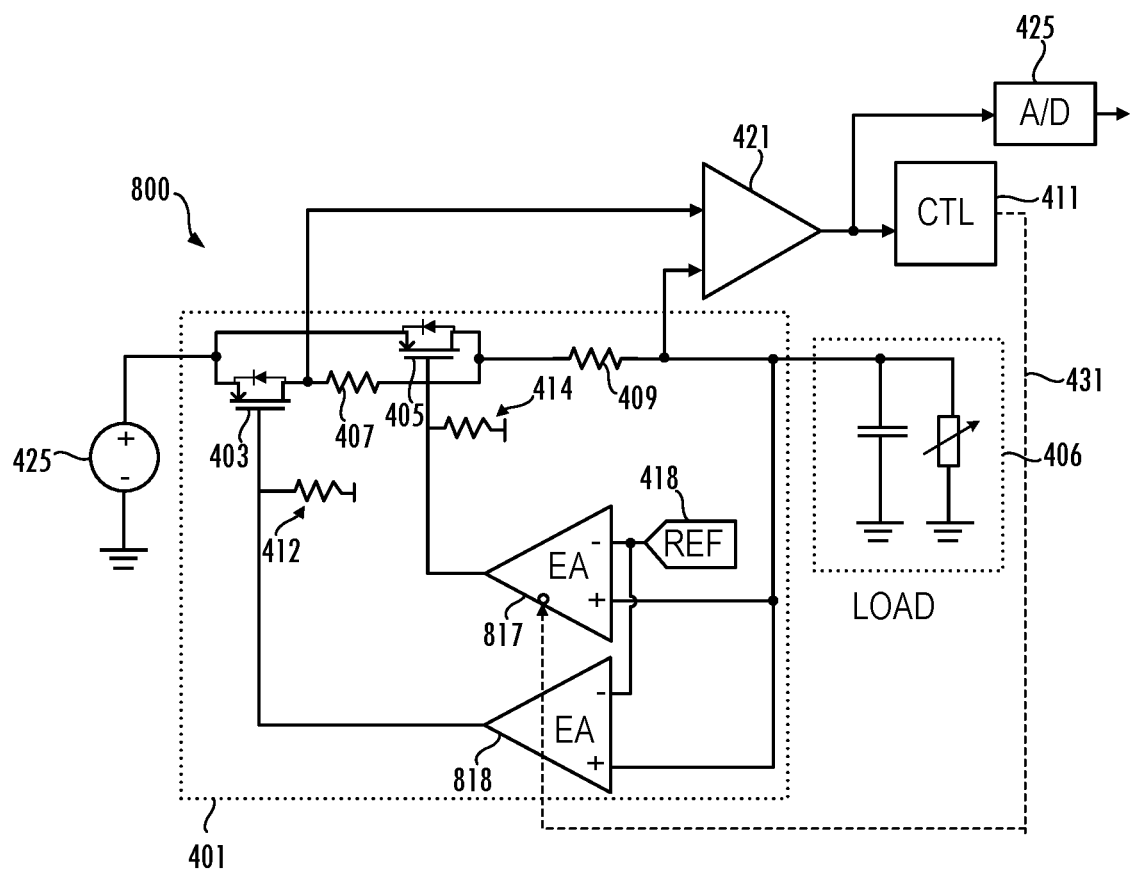
FIG. 8 illustrates an embodiment of a current measurement system using multiple error amplifiers.

FIG. 8 illustrates a high level block diagram of another embodiment of a current measurement system 800 having two error amplifiers 817 and 818 that are mutually exclusively enabled. That is, the output of only one error amplifier 817 or 818 is enabled at any one time. Rather than a switch, the non-selected error amplifier is disabled such that the pull-up circuit 412 or 414 turns off the corresponding pass transistor. EA 817 is dedicated to pass transistor 405 and EA 808 is dedicated to pass transistor 403. The control line 431 controls which of the two EAs are enabled (allowed to output a signal to a pass transistor). In the embodiment of FIG. 8, the control line is supplied to a complementary input on EA 817 so when EA 817 is turned off, EA 818 is turned on, and vice versa. When the current switches between a "high" current and a "low" current as described earlier, one of the EAs switches from disabled to enabled and the other EA switches from enabled to disabled. The use of two error amplifiers allows differentiating compensation networks used in the LDO based on the load range of the supplied current.

While the various embodiments described herein can be implemented on a printed circuit board, in other embodiments the various current sense architectures with multiple channel LDO with integrated I-V conversion described herein are integrated into an integrated circuit (IC). For an IC design, the sense resistors can be external or internal to the IC. Note also that features described for one embodiment can be utilized by another. For example, the multiple AFEs described in FIG. 7 can be used with the multiple EAs described in FIG. 8.

Thus, current sensing systems has been described that improve the accuracy of current measurement. Embodiments includes a multiple channel LDO voltage regulator with integrated I-V conversion. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An apparatus for measuring a current being supplied to a load comprising:
    a first pass transistor to serially couple a first sense resistance to the load;
    a second pass transistor to serially couple a second sense resistance to the load;
    an error amplifier to determine a difference between a voltage being supplied to the load and a reference voltage and to supply an error amplifier output signal according to the difference;
    a switch circuit to supply the error amplifier output signal to the first pass transistor or to the second pass transistor based on the current being supplied to the load; and
    a current sense circuit to determine the current being supplied to the load, the current sense circuit being coupled to determine a first voltage across the first sense resistance according to a first setting of the switch circuit and to determine a second voltage across the second sense resistance according a second setting of the switch circuit.

2. The apparatus as recited in claim 1, wherein the first pass transistor and the second pass transistor are arranged in a common source configuration.

3. The apparatus as recited in claim 1, wherein the first pass transistor and the second pass transistor are arranged in a common drain configuration.

4. The apparatus as recited in claim 1, wherein the current sense circuit comprises a current sense amplifier.

5. The apparatus as recited in claim 4 further comprising:
    a control logic coupled to an output of the current sense circuit and to the switch circuit to selectively couple the first pass transistor or the second pass transistor to the error amplifier output signal through the switch circuit.

6. The apparatus as recited in claim 5 wherein
    the control logic compares a representation of the current based on an output of the current sense amplifier and causes current to the load to pass through the first sense resistance responsive to the representation of the current being within a range of first current values and causes current to the load to pass through the second sense resistance responsive to the representation of the current being within a range of second values.

7. The apparatus as recited in claim 1 wherein the switch circuit further comprises:
    a first transistor coupled between a gate of the first pass transistor and the error amplifier output signal; and
    a second transistor coupled between a gate of the second pass transistor and the error amplifier output signal, one of the first transistor and second transistor being turned on according to the current being supplied to the load, wherein a voltage being supplied to the load is controlled using the error amplifier output signal that is selectively coupled to the gate of the first pass transistor or the gate of the second pass transistor.

8. The apparatus as recited in claim 1 wherein the second sense resistance includes at least a portion of the first sense resistance.

9. The apparatus as recited in claim 1 wherein the first sense resistance is higher than the second sense resistance and control logic selects the first sense resistance to carry current being supplied to the load responsive to the current being within first current values and selects the second sense resistance to carry current being supplied to the load responsive to the current being within second current values, the first current values being smaller than the second current values.

10. The apparatus as recited in claim 1 further comprising:
    a first pull-up circuit to inactivate the first pass transistor when the first pass transistor is not coupled to the error amplifier; and a second pull-up circuit to inactive the second pass transistor when the second pass transistor is not coupled to the error amplifier.

11. A method for measuring a current being supplied to a load comprising:
selectively causing current to flow to the load through a first pass transistor and a first sense resistance or a second pass transistor and a second sense resistance according to the current being supplied to the load;
comparing a reference voltage to a load voltage being supplied to the load in an error amplifier and supplying an error amplifier output signal according to a difference between the reference voltage and the load voltage;
selectively coupling the error amplifier output signal to the first pass transistor or the second pass transistor according to the current being supplied to the load to thereby select the first sense resistance or the second sense resistance to carry the current to the load;
supplying a first voltage across the first sense resistance to a current sense amplifier when the current is being supplied to the load through the first sense resistance;
supplying a second voltage across the second sense resistance to the current sense amplifier when the current is being supplied to the load through the second sense resistance; and
supplying an output of the current sense amplifier indicative of the current being supplied to the load.

12. A method for measuring a current being supplied to a load comprising:
selectively causing current to flow to the load through a first pass transistor and a first sense resistance or a second pass transistor and a second sense resistance according to the current being supplied to the load;
comparing a reference voltage to a load voltage being supplied to the load in an error amplifier and supplying an error amplifier output signal according to a difference between the reference voltage and the load voltage;
selectively coupling the error amplifier output signal to the first pass transistor or the second pass transistor according to the current being supplied to the load to thereby select the first sense resistance or the second sense resistance to carry the current to the load;
coupling the error amplifier output signal to the first pass transistor responsive to the current being supplied to the load being above a first current range;
coupling the error amplifier output signal to the second pass transistor responsive to the current being supplied to the load being below a second current range; and
wherein the first sense resistance has a lower resistance value than the second sense resistance.

13. The method as recited in claim 11 further comprising:
selecting the first sense resistance when the first pass transistor is coupled to the error amplifier output signal; and
selecting the second sense resistance when the second pass transistor is coupled to the error amplifier output signal.

14. The method as recited in claim 11 further comprising:
controlling a voltage being supplied to the load using the error amplifier output signal selectively coupled to the first pass transistor or the second pass transistor.

15. The method as recited in claim 11 further comprising:
supplying the output of the current sense amplifier to control logic;
generating a control logic output based on the output of the current sense amplifier; and
controlling a switch using the control logic output to selectively couple the error amplifier output signal to the first pass transistor or the second pass transistor.

16. The method as recited in claim 11 further comprising forming the first sense resistance using at least a portion of the second sense resistance.

17. An apparatus for measuring a current being supplied to a load comprising:
a first pass transistor to couple a first sense resistance to the load when the first pass transistor is enabled;
a second pass transistor to couple a second sense resistance to the load when the second pass transistor is enabled;
an error amplifier to determine a difference between a voltage being supplied to the load and a reference voltage and to supply an error amplifier output signal according to the difference;
a switch circuit to couple the error amplifier output signal to a gate of at least the first pass transistor or at least to the gate of the second pass transistor;
control logic to control the switch circuit according to a value of the current being supplied to the load;
wherein a voltage being supplied to the load is controlled using the error amplifier output signal that is selectively coupled at least to the gate of the first pass transistor or at least to the gate of the second pass transistor; and
a current sense circuit coupled to measure the voltage across the first sense resistance and to measure the voltage across the second sense resistance and supply a voltage to the control logic indicative of the current being supplied to the load.

18. The apparatus as recited in claim 17 wherein the current sense circuit comprises a current sense amplifier.

19. The apparatus as recited in claim 17 wherein responsive to at least one value of the current being supplied to the load, the error amplifier output signal is coupled to both the gate of the first pass transistor and to the gate of the second pass transistor.

20. The apparatus as recited in claim 17 wherein the switching circuit couples the error amplifier output signal to a gate of the first pass transistor, a gate of the second pass transistor, or to the gate of the first pass transistor and to the gate of the second pass transistor.

21. An apparatus for measuring a current being supplied to a load comprising:
a first pass transistor to couple a first sense resistance to the load;
a second pass transistor to couple a second sense resistance to the load;
a first error amplifier selectively enabled to supply a first error amplifier output signal to a gate of the first pass transistor, the first error amplifier output signal indicative of a first difference between a voltage being supplied to the load at a first time and a reference voltage;
a second error amplifier selectively enabled to supply a second error amplifier output signal to a gate of the second pass transistor, the second error amplifier output signal indicative of a second difference between the voltage being supplied to the load at a second time and the reference voltage;
a current sense circuit coupled to determine a first voltage across the first sense resistance indicative of the current being supplied to the load with the first error amplifier enabled and to determine a second voltage across the second sense resistance indicative of the current being supplied to the load with the second error amplifier enabled; and control logic coupled to the current sense circuit and configured to enable the first error amplifier responsive to a first value of the current being supplied to the load and to enable the second error amplifier responsive to a second value of the current being supplied to the load.

\* \* \* \* \*

UNITED STATES PATENT AND TRADEMARK OFFICE
CERTIFICATE OF CORRECTION

PATENT NO. : 11,803,203 B2  
APPLICATION NO. : 17/473197  
DATED : October 31, 2023  
INVENTOR(S) : Franco Maggi and Peter Pap Page 1 of 1

It is certified that error appears in the above-identified patent and that said Letters Patent is hereby corrected as shown below:

On the Title Page

Abstract, in Line 8, please replace "and to supplies" with --and supplies--.

In the Claims

In Claim 10, (Column 9, Line 1) change "inactive" to --inactivate--.

Signed and Sealed this  
Second Day of January, 2024

Katherine Kelly Vidal  
*Director of the United States Patent and Trademark Office*